(12) United States Patent
Chen et al.

(10) Patent No.: US 7,990,736 B2
(45) Date of Patent: Aug. 2, 2011

(54) MOUNTING APPARATUS FOR EXPANSION CARD

(75) Inventors: Wen-Tzu Chen, Taipei Hsien (TW);
Chen-Lu Fan, Taipei Hsien (TW);
Ho-Chin Tsai, Taipei Hsien (TW);
Li-Ping Chen, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 219 days.

(21) Appl. No.: 12/421,716

(22) Filed: Apr. 10, 2009

(65) Prior Publication Data

US 2010/0002378 A1  Jan. 7, 2010

(30) Foreign Application Priority Data

Jul. 1, 2008  (CN) .......................... 200820301401.1

(51) Int. Cl.
*H05K 7/14* (2006.01)
*H05K 7/18* (2006.01)
(52) U.S. Cl. .......................... 361/802; 361/801; 361/810
(58) Field of Classification Search .................. 361/807, 361/810, 752, 730, 790, 797, 800–803, 796; 16/221, 382, 384; 220/200, 234, 238; 312/223.1, 312/223.2
See application file for complete search history.

(56) References Cited

U.S. PATENT DOCUMENTS

| | | | |
|---|---|---|---|
| 6,287,138 B1 * | 9/2001 | Kuang | 439/372 |
| 6,480,392 B1 * | 11/2002 | Jiang | 361/755 |
| 6,608,765 B2 * | 8/2003 | Vier et al. | 361/801 |
| 6,674,650 B1 * | 1/2004 | Davis et al. | 361/796 |
| 7,335,045 B1 * | 2/2008 | Liang et al. | 439/327 |
| 7,561,440 B2 * | 7/2009 | Dai | 361/801 |
| 2004/0037048 A1 | 2/2004 | Liao | |

* cited by examiner

*Primary Examiner* — Hung S Bui
(74) *Attorney, Agent, or Firm* — Clifford O. Chi

(57) ABSTRACT

A mounting apparatus is configured for securing an expansion card with a support portion, and includes a chassis with a plate, and a securing member pivotably secured on the plate. The plate defines an opening for the support portion of the expansion card inserting therethrough. A positioning portion is formed on the plate to locate the support portion of the expansion card. The positioning portion defines a locking hole therein. The securing member includes a bent portion and a locking portion to sandwich the support portion of the expansion card and the positioning portion of the plate therebetween. A locking block protrudes from the locking portion to engage in the locking hole of the positioning portion. The locking portion is resiliently deformable to disengage the locking block from the locking hole of the positioning portion.

20 Claims, 5 Drawing Sheets

MOUNTING APPARATUS FOR EXPANSION CARD

BACKGROUND

1. Technical Field

The present disclosure relates to mounting apparatuses, and particularly to a mounting apparatus for securing an expansion card in an electronic device.

2. Description of Related Art

A computer system usually includes expansion cards, such as sound cards, video cards, graphics cards and so on, for enhancing capabilities of the computer system. The expansion cards are often fixed in the computer system by screws. However, installing screws to fix the expansion cards is very laborious and time-consuming.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
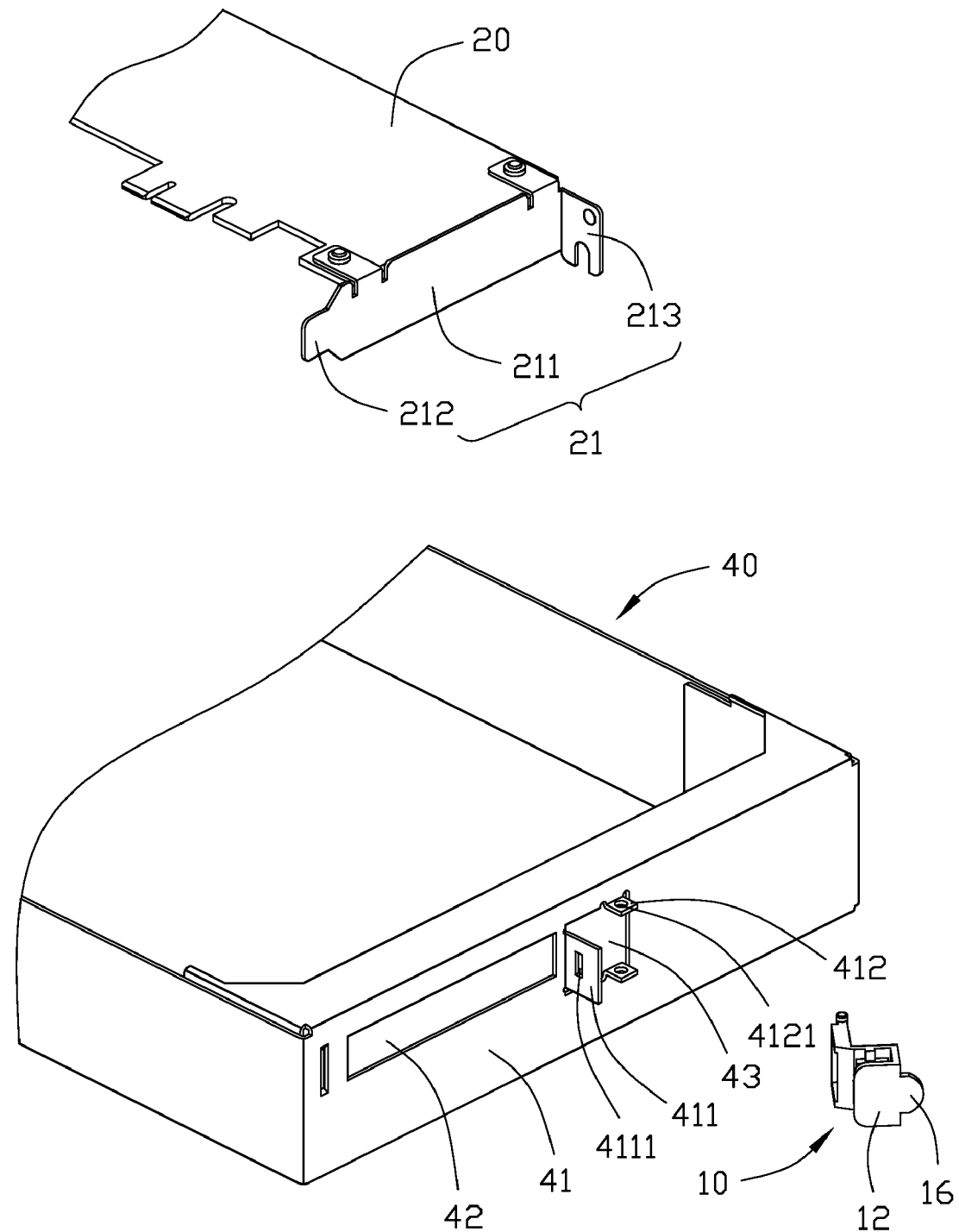
FIG. 1 is an exploded, isometric view of one embodiment of an electronic device, the electronic device including a chassis, a securing member, and an expansion card.

Referring to FIG. 1, one embodiment of a mounting apparatus is configured for securing an expansion card 20, and includes a chassis 40 and a securing member 10 pivotably attached to the chassis 40.

The expansion card 20 may be a sound card, a video card, or a graphics card, or other PCI (Peripheral Component Interconnection) cards, and includes a positioning member 21. The positioning member 21 includes a base portion 211, an insertion portion 212 formed on and extending from an end of the base portion 211, and a support portion 213 bent substantially perpendicularly from an opposite end of the base portion 211.

Figure 3:
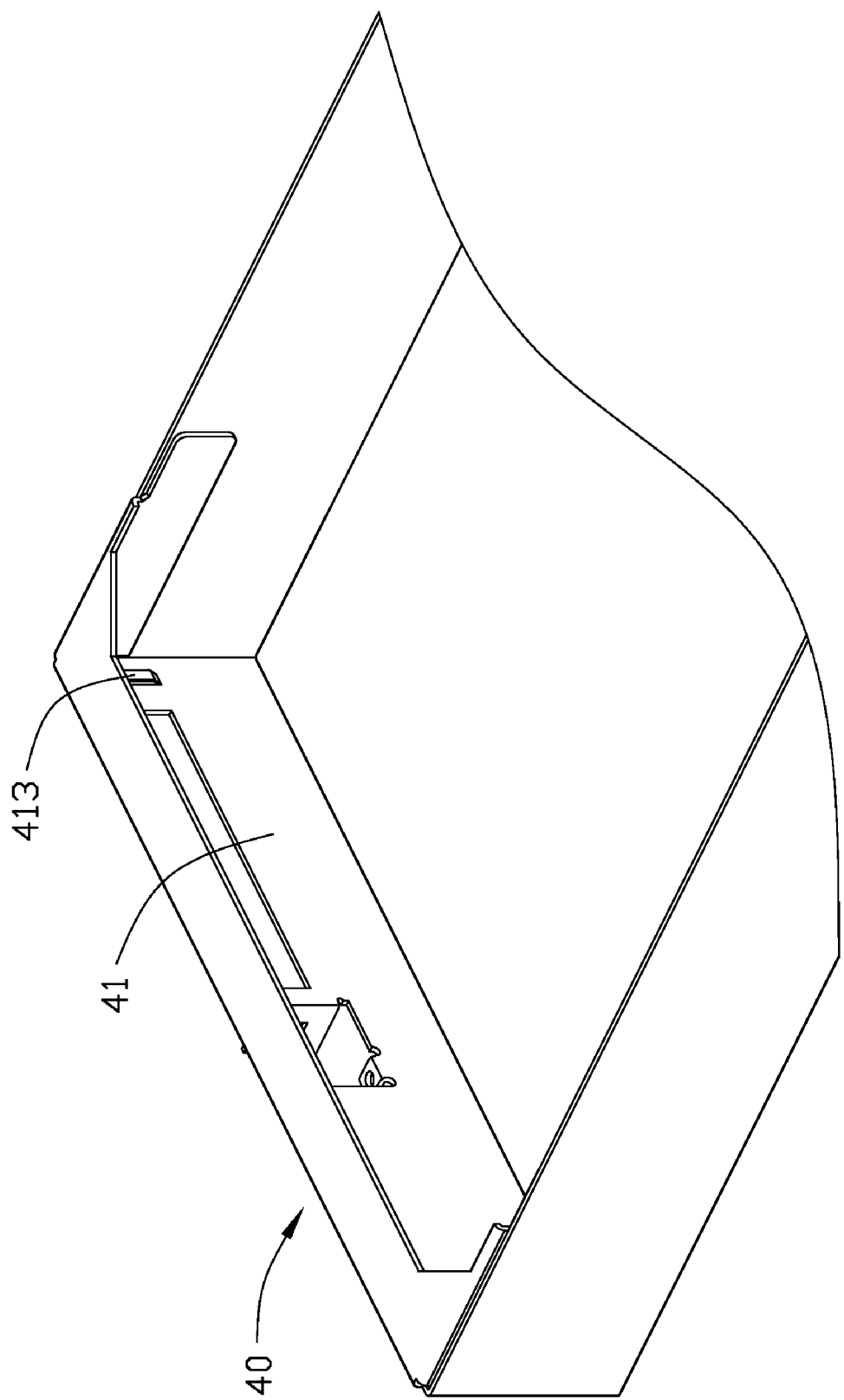
FIG. 3 is another isometric view of the chassis of FIG. 1.

The chassis 40 is configured to receive electronic devices, such as a motherboard, hard disk drives, expansion cards, and so on, and includes a plate 41 with a slot 42 defined therein. An opening 43 is defined in the plate 41 at one side of the slot 42, and is configured to allow insertion of the support portion 213 of the expansion card 20 therethrough. A clip 413 (shown in FIG. 3) protrudes from an inner surface of the plate 31 at an opposite side of the slot 42. A positioning portion 411 and a pair of tabs 412 are bent substantially perpendicularly out from adjacent edges of the opening 43 on an outer surface of the plate 41. An engaging means, such as a locking hole 4111, is defined in the positioning portion 411, and a pivot hole 4121 is defined in each of the tabs 412.

Figure 2:
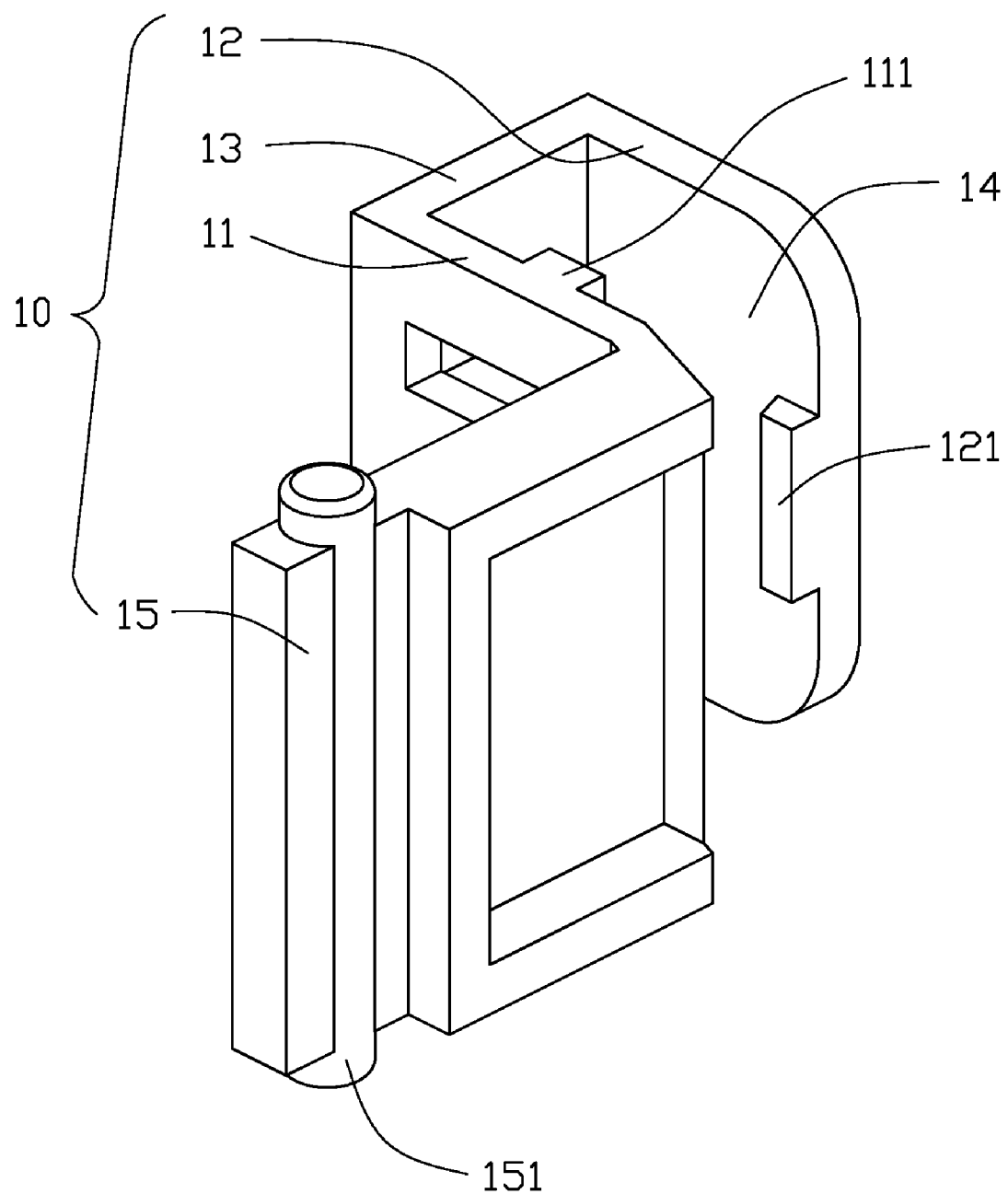
FIG. 2 is another isometric view of the securing member of FIG. 1.

Referring to FIGS. 1-2, the securing member 10 includes a base portion 15 extending in a first direction, a bent portion 11 bent from an edge of the base portion 15 in a second direction substantially perpendicular to the first direction, a connecting portion 13 extending from an edge of the bent portion 11 in a third direction substantially perpendicular to the second direction and opposite to the first direction, and a locking portion 12 extending from the connecting portion 13 in a fourth direction opposite to the third direction. A shaft 151 is formed on the base portion 15 and is configured to pivotably engage in the pivot holes 4121 of the pivot tabs 412 of the chassis 40. A holding space 14 is defined in the securing member 20 and surrounded by the bent portion 11, the connecting portion 13, and the locking portion 12. A pressing block 111 protrudes from the bent portion 11 towards the locking portion 12. An engaging means, such as a locking block 121, protrudes from a free end of the locking portion 12 towards the bent portion 11 and is configured to engage in the locking hole 4111 of the positioning portion 411 of the chassis 40. An operating piece 16 extends from a joint edge of the locking portion 12 and the connecting portion 13 in a direction opposite to the fourth direction.

Figure 4:
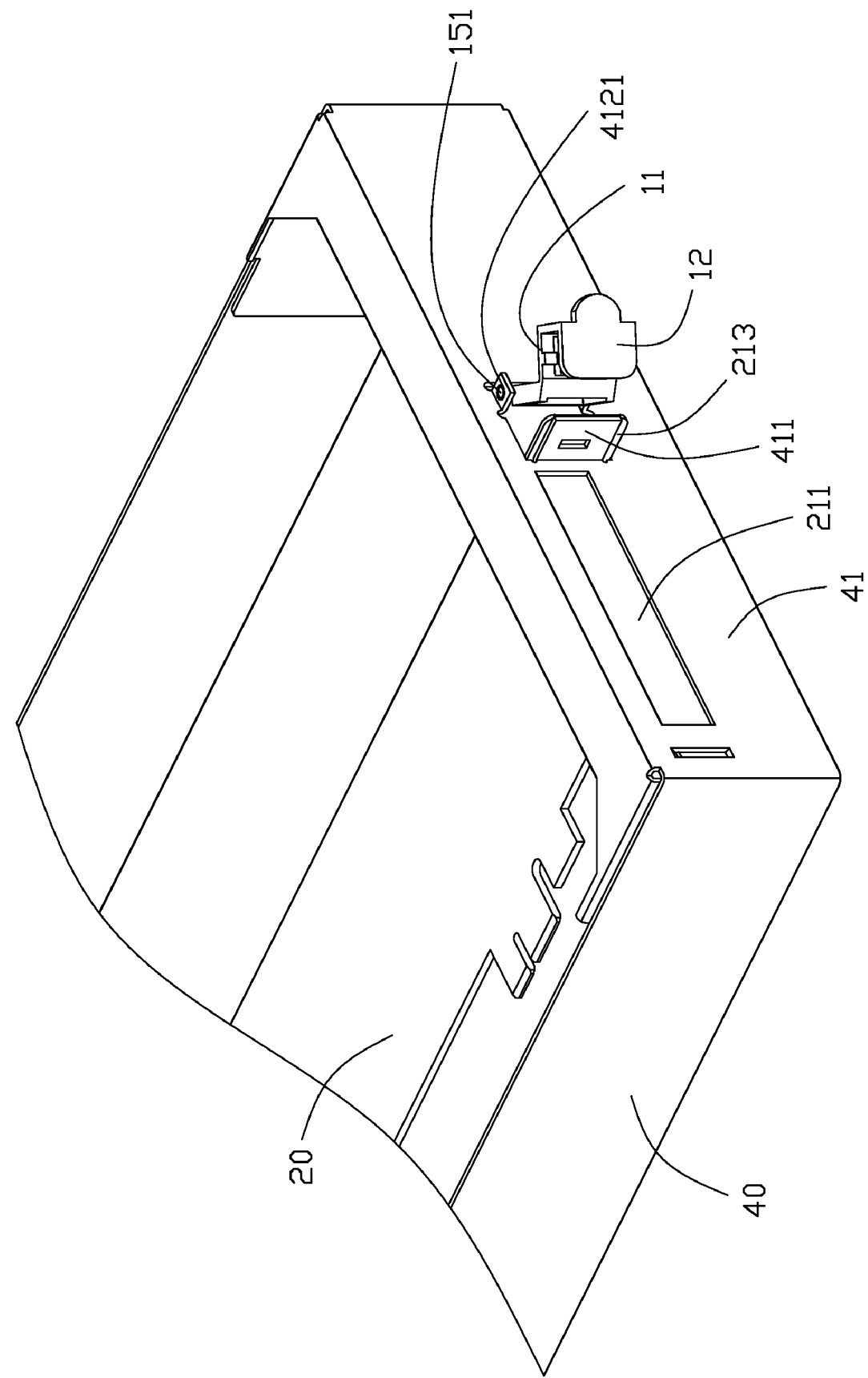
FIG. 4 is an assembled, isometric view of FIG. 1, showing the locking member in an unlocked position.

Referring also to FIG. 4, to install the expansion card 10, the shaft 151 of the securing member 10 is pivotably engaged in the pivot holes 4121 of the pivot tab 412 of the plate 41, and the securing member 10 is thereby pivotably attached to the outer surface of the plate 41. At this point the shaft 151 is substantially parallel to the positioning portion 411. The securing member 10 is then rotated away from the positioning portion 411 of the plate 41, and positioned in an unlocked position. The insertion portion 212 of the expansion card 20 is inserted in between the clip 413 and the inner surface of the plate 41. The support portion 213 of the expansion card 20 is extended through the opening 43 and positioned on the positioning portion 411 of the plate 41. The slot 42 of the plate 41 is covered by the base portion 211 of the positioning member 21.

Figure 5:
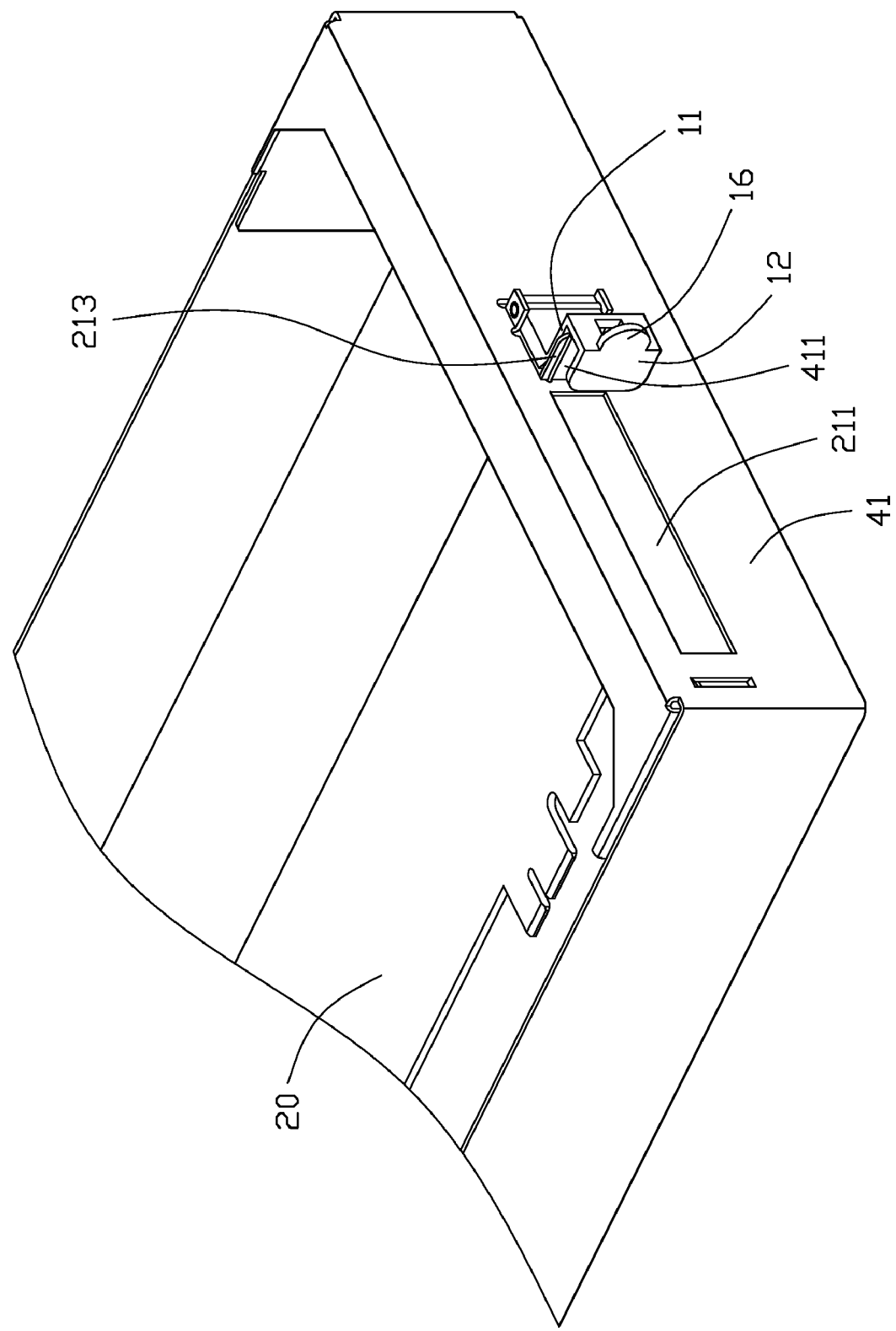
FIG. 5 is similar to FIG. 4, but showing the locking member in a locked position.

Referring also to FIG. 5, the securing member 10 can be rotated from the unlocked position towards the positioning portion 411 of the plate 41. After the locking portion 12 abuts an edge of the positioning portion 411, the operating piece 16 is operated to resiliently deform the locking portion 12 and thereby reshape the holding space 14, so that the securing member 10 can be further rotated towards the positioning portion 411. The support portion 213 and the positioning portion 411 are inserted in the holding space 14 of the securing member 10. When the locking block 121 of the locking portion 12 is aligned with the locking hole 4111 of the positioning portion 411, the locking portion 12 rebounds to engage the locking block 121 in the locking hole 4111. The pressing block 111 of the bent portion 11 presses on the support portion 213 of the expansion card 20. Thus, the expansion card 20 is secured in the chassis 40, and the securing member 10 is positioned in a locked position.

In removing the expansion card 20 from the chassis 40, the operating piece 16 of the securing member 10 is pressed to resiliently deform the locking portion 12 and thereby reshape the holding space 14 until the locking block 121 is disengaged from the locking hole 4111 of the positioning portion 411. The securing member 10 can then be rotated away from the positioning portion 411 from the locked position to the unlocked position. When the positioning portion 411 is disengaged from the holding space 14 of the securing member 10, the expansion card 20 can be removed from the chassis 40.

It is to be understood, however, that even though numerous characteristics and advantages have been set forth in the foregoing description of embodiments, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for securing an expansion card with a support portion, the mounting apparatus comprising:

a chassis comprising a plate, the plate defining an opening for the support portion of the expansion card inserting therethrough, a positioning portion being formed on the plate outside of the chassis, to locate the support portion of the expansion card, the positioning portion defining a locking hole therein; and a securing member pivotably secured to the outer surface of the plate, the securing member comprising a bent portion and a locking portion, to sandwich the support portion of the expansion card and the positioning portion of the plate therebetween, a locking block protruding from the locking portion, to engage in the locking hole of the positioning portion, the locking portion being resiliently deformable to disengage the locking block from the locking hole of the positioning portion.

2. The mounting apparatus of claim 1, wherein a pressing block protrudes from the bent portion of the securing member, to press the support portion of the expansion card on the positioning portion when the support portion of the expansion card and the positioning portion of the plate are sandwiched between the bent portion and the locking portion.

3. The mounting apparatus of claim 1, wherein an extending direction of the bent portion of the securing member is substantially parallel to an extending direction of the locking portion.

4. The mounting apparatus of claim 3, wherein the securing member further comprises a connecting portion connected between the bent portion and the locking portion; an extending direction of the connecting portion is substantially perpendicular to the extending directions of the bent portion and the locking portion.

5. The mounting apparatus of claim 4, wherein the securing member further comprises a base portion connecting with the bent portion and extending in a direction substantially parallel to the extending direction of the connecting portion.

6. The mounting apparatus of claim 5, wherein a pair of pivot tabs protrudes from the plate; each of the pivot tabs defines a pivot hole therein; a shaft is formed on the base portion of the securing member, to pivotably engage in the pivot holes of the pivot tabs.

7. The mounting apparatus of claim 5, wherein a clip is formed on the plate; an inserting portion is formed on the expansion card, to insert between the clip and the plate for securing the expansion card on the plate.

8. The mounting apparatus of claim 1, wherein an operating piece is formed on the locking portion of the securing member, to conveniently deform the locking portion.

9. An electronic device, comprising:

a chassis comprising a plate, the plate defining an opening therein, a positioning portion being formed on the plate and defining a locking hole therein;

an expansion card with a support portion formed thereon, the support portion to insert through the opening to locate on the positioning portion of the plate; and a securing member pivotably secured on the plate, the securing member defining a holding space to receive the support portion of the expansion card and the positioning portion of the plate, a locking block protruding from the securing member, to engage in the locking hole of the positioning portion, a portion of the securing member being resiliently deformable to reshape the holding space and thereby to disengage the locking block from the locking hole.

10. The electronic device of claim 9, wherein a pressing block is formed on the securing member, to press the support portion of the expansion card on the positioning portion of the plate when the support portion and the positioning portion is received in the holding space.

11. The electronic device of claim 10, wherein the pressing block and the locking block of the securing member are positioned in the holding space.

12. The electronic device of claim 9, wherein the securing member comprises a bent portion, a locking portion substantially parallel to the bent portion, and a connecting portion substantially perpendicular to the bent portion and the locking portion; and the bent portion, the connecting portion and the locking portion cooperatively define the holding space.

13. The electronic device of claim 9, wherein a pair of pivot tabs protrudes from the plate; each of the pivot tabs defines a pivot hole therein; a shaft is formed on the securing member, to pivotably engage in the pivot holes of the pivot tabs.

14. The electronic device of claim 9, wherein a clip is formed on the plate; an inserting portion is formed on the expansion card, to insert between the clip and the plate for securing the expansion card on the plate.

15. An electronic device, comprising:

a chassis comprising a plate with a positioning portion formed thereon, a first engaging means being formed on the positioning portion;

an expansion card having a portion located on the positioning portion; and a securing member pivotably secured on the plate, the securing member being rotatable about an axle that is substantially perpendicular to the plate, a second engaging means being formed on the securing member, to engage with the first engaging means so as to attach the expansion card in the chassis, the securing member defining a holding space to receive the portion of the expansion card and the positioning portion of the plate and being resiliently deformable to reshape the holding space to disengage the second engaging means from the first engaging means so as to remove the expansion card from the chassis.

16. The electronic device of claim 15, wherein the plate defines an opening therein; the portion of the expansion card to insert through the opening of the plate to locate on the positioning portion of the plate.

17. The electronic device of claim 15, wherein the first engaging means is a locking hole defined in positioning portion of the plate; the second engaging means is a locking block protruding from the securing member in the holding space.

18. The electronic device of claim 15, wherein a pressing block is formed on the securing member and positioned in the holding space; the pressing block to press the support portion of the expansion card on the positioning portion of the plate when the support portion and the positioning portion is received in the holding space.

19. The electronic device of claim 15, wherein the securing member comprises a bent portion, a locking portion substantially parallel to the bent portion, and a connecting portion substantially perpendicular to the bent portion and the locking portion; and the bent portion, the connecting portion and the locking portion cooperatively define the holding space.

20. The electronic device of claim 15, wherein a pair of pivot tabs protrudes from the plate; each of the pivot tabs defines a pivot hole therein; a shaft is formed on the securing member, to pivotably engage in the pivot holes of the pivot tabs.

* * * * *